(12) United States Patent
Sze et al.

(10) Patent No.: US 11,011,435 B2
(45) Date of Patent: May 18, 2021

(54) APPARATUS AND METHOD INSPECTING BONDED SEMICONDUCTOR DICE

(71) Applicant: ASM Technology Singapore Pte Ltd, Singapore (SG)

(72) Inventors: Wui Fung Sze, Hong Kong (HK); Jiangwen Deng, Hong Kong (HK); Lap Kei Chow, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 39 days.

(21) Appl. No.: 16/196,161

(22) Filed: Nov. 20, 2018

(65) Prior Publication Data

US 2020/0161193 A1    May 21, 2020

(51) Int. Cl.
| | |
|---|---|
| *G01C 3/08* | (2006.01) |
| *H01L 21/66* | (2006.01) |
| *H01L 23/00* | (2006.01) |
| *G01B 11/06* | (2006.01) |
| *H01L 23/31* | (2006.01) |

(52) U.S. Cl.
CPC .............. *H01L 22/12* (2013.01); *G01B 11/06* (2013.01); *H01L 24/75* (2013.01); *H01L 24/83* (2013.01); *G01B 2210/56* (2013.01); *H01L 23/3185* (2013.01); *H01L 2224/759* (2013.01); *H01L 2224/83908* (2013.01)

(58) Field of Classification Search
CPC ......... H01L 22/12; H01L 24/75; H01L 24/83; H01L 2224/83908; H01L 2224/759; H01L 23/3185; G01B 11/06; G01B 2210/56
See application file for complete search history.

(56) References Cited

U.S. PATENT DOCUMENTS

| | | | | |
|---|---|---|---|---|
| 4,742,376 A * | 5/1988 | Phillips | ................. | G03F 9/7026 355/43 |
| 6,151,407 A * | 11/2000 | Conlon | .............. | G01N 21/8806 362/294 |
| 6,455,354 B1 * | 9/2002 | Jiang | ....................... | H01L 23/13 257/783 |
| 9,543,242 B1 * | 1/2017 | Kelly | ................ | H01L 23/49816 |
| 2008/0286885 A1 * | 11/2008 | Izikson | ............... | G03F 7/70625 438/7 |
| 2009/0028683 A1 * | 1/2009 | Zywno | ................ | H01J 37/3174 414/754 |
| 2009/0182528 A1 * | 7/2009 | De Groot | ............... | G01B 11/06 702/167 |
| 2015/0377959 A1 * | 12/2015 | Nakamura | ......... | G01N 21/9501 324/754.23 |
| 2016/0246285 A1 * | 8/2016 | Veldman | ............. | G03F 7/70625 |
| 2020/0057028 A1 * | 2/2020 | Piras | ...................... | G01N 29/12 |

* cited by examiner

*Primary Examiner* — Samantha K Abraham
(74) *Attorney, Agent, or Firm* — Ostrolenk Faber LLP

(57) ABSTRACT

An apparatus for inspecting a semiconductor die bonded on a top surface of a substrate uses an optical assembly including an image sensor and an optical system for conducting the inspection. The optical assembly is tilted at an oblique angle with respect to the top surface of the substrate, and is arranged such that its depth of focus is substantially perpendicular to the top surface of the substrate for inspecting at least one side wall of the semiconductor die.

17 Claims, 4 Drawing Sheets

APPARATUS AND METHOD INSPECTING BONDED SEMICONDUCTOR DICE

FIELD OF THE INVENTION

The invention relates to the manufacturing of semiconductor packages, and in particular to the inspection of bonded semiconductor dice during a semiconductor packaging process.

Background and Prior Art

In die bonding applications for semiconductor packaging, epoxy is often used as a medium to bond a semiconductor die onto a bond pad of a substrate. A layer of liquid epoxy is first dispensed onto a bond pad of the substrate, and then the semiconductor die is pressed onto a layer of epoxy that is on the bond pad. When pressing the semiconductor die, some epoxy is squeezed out from underneath the semiconductor die to cover side surfaces of the semiconductor die up to a certain height, thus forming a fillet surrounding the bonded semiconductor die. FIG. 1 is an illustration of a substrate 10 which has a semiconductor die 12 bonded onto it using epoxy. Some epoxy has been squeezed out from underneath the semiconductor die 12 to form a fillet 14 surrounding the die. A height, h, of the fillet 14 so formed is an important indicator of bonding quality.

Conventionally, inspection of bonded semiconductor dice is conducted with a camera positioned over the substrate to obtain a plan view of the same. As such, only a two-dimensional image of the semiconductor dice 12 bonded on the substrate 10 can be obtained by the camera. Thus, online inspection is limited to defects such as bonding accuracy and bleed-out that are observable from above the semiconductor dice 12. The two-dimensional image at best provides only an indirect approximation of fillet height, h. After the die bonding equipment has bonded the required semiconductor dice 12, the sample substrate 10 has to be inspected offline for further quality checks, for instance fillet height, die tilt and bond line thickness ("BLT"). It would be appreciated that fillet height cannot be measured within the conventional die bonding equipment due to the complexity of mounting imaging cameras for online measurement in this environment.

Since the final bonding quality can only be verified offline using the conventional approach described as aforesaid, there is a real risk that defective bonded semiconductor dice are only discovered after completion of the entire die bonding process, resulting in low yields especially where a large number of semiconductor dice 12 are only found later to be defective.

SUMMARY OF THE INVENTION

It is thus an object of the invention to seek to provide an apparatus and method for accurate online inspection of aspects of bonded semiconductor dice, such as fillet height, during a die bonding process.

According to a first aspect of the invention, there is provided an apparatus for inspecting a semiconductor die bonded on a top surface of a substrate, the apparatus comprising: an optical assembly tilted at an oblique angle with respect to the top surface of the substrate, the optical assembly including an image sensor and an optical system; wherein the optical assembly is arranged such that its depth of focus is substantially perpendicular to the top surface of the substrate for inspecting at least one side wall of the semiconductor die.

According to a second aspect of the invention, there is provided an apparatus for inspecting a semiconductor die bonded on a top surface of a substrate, the apparatus comprising: a first optical assembly and a second optical assembly, each optical assembly being tilted at an oblique angle with respect to the top surface of the substrate, and each optical assembly including an image sensor and an optical system; wherein each of the first and second optical assemblies is arranged such that its depth of focus is substantially perpendicular to the top surface of the substrate for inspecting at least one side wall of the semiconductor die.

According to a third aspect of the invention, there is provided a method for inspecting a semiconductor die bonded on a top surface of a substrate, the method comprising: bonding the semiconductor die onto the top surface of the substrate; inspecting the semiconductor die with an optical assembly tilted at an oblique angle with respect to the top surface of the substrate, the optical assembly including an image sensor and an optical system; wherein the optical assembly is arranged such that its depth of focus is substantially perpendicular to the top surface of the substrate for inspecting at least one side wall of the semiconductor die.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary apparatus and method for inspecting bonded semiconductor dice in accordance with the invention will now be described with reference to the accompanying drawings, in which.

DETAILED DESCRIPTION OF THE PREFERRED EMBODIMENT OF THE INVENTION

Figure 1:
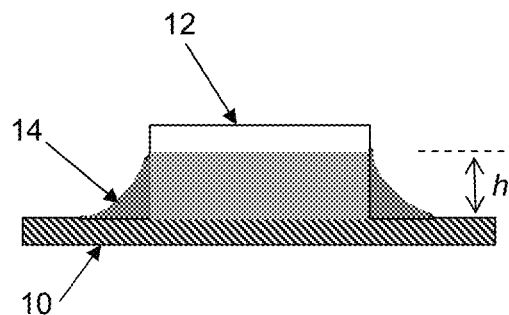
FIG. 1 is a side view of a substrate which has a semiconductor die bonded on it using epoxy.
Figure 2:
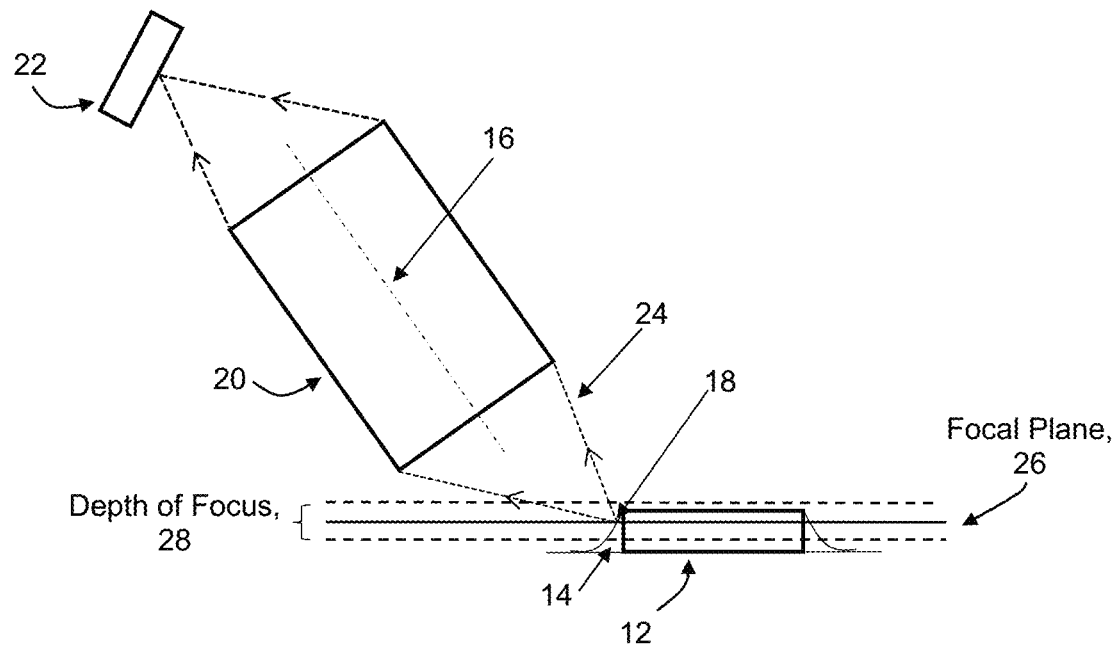
FIG. 2 is a schematic illustration of the layout of a tilted optical assembly according to a preferred embodiment of the invention.

FIG. 2 is a schematic illustration of the layout of a tilted optical assembly for inspecting a semiconductor die bonded on a top surface of a substrate according to a preferred embodiment of the invention. The tilted optical assembly generally comprises an optical system 20 having an optical axis 16 and an image sensor 22. The optical assembly is tilted at an oblique angle with respect to the top surface of the substrate 10, for instance, when the optical axis 16 of the optical system 20 is tilted at an oblique angle with respect to the top surface of the substrate 10.

Due to the arrangement of the image sensor 22, which is offset with respect to the optical axis 16, a focal point 18 of the tilted optical assembly is correspondingly offset with respect to the optical axis 16. In the illustration of FIG. 2, the image sensor 22 and the focal point 18 are located on opposite sides of the optical axis 16. The focal point 18 is preferably arranged at a height which is the same as or close to a desired or expected height h of the fillet 14. As the tilted optical assembly comprising the optical system 20 and the image sensor 22 moves relative to the semiconductor die 12 at a certain fixed height, a virtual focal plane 26 is formed that is coincident with positions of the focal point 18 as the optical assembly moves. Such a virtual focal plane 26 is generally parallel to a plane defined by the top surface of the semiconductor die 12 and the substrate 10.

The optical system 20 and image sensor 22 are arranged such that the tilted optical assembly inherently has a depth of focus 28 that is substantially perpendicular to the top surface of the substrate 10 for inspecting a height of a fillet 14 surrounding the semiconductor die 12. As such, the depth of focus extends substantially transversely to the virtual focal plane 26 for a certain distance above and below the virtual focal plane 26, with the focal plane 26 generally in the middle. The vertically arranged depth of focus 28 of the optical assembly corresponds to a vertical side wall of the semiconductor die 12 so as to ensure that an image of a top of the fillet 14 that is either above or below the virtual focal plane 26 along the side wall of the semiconductor die 12 (which lies within a range of heights outside the virtual focal plane 26) is in focus, and is identifiable by the image sensor 22. Lights rays 24 reflected from around the focal point 26 are transmitted by the optical system 20 to the image sensor 22 at an offset to the optical axis 16.

A benefit of tilting the image sensor 22 with respect to the optical axis 16 is that the depth of focus 28 of the tilted optical assembly corresponds to a vertical side wall of the semiconductor die 12 that the top of the fillet 14 is expected to be located next to. On the other hand, if the image sensor 22 were aligned with the optical axis 16, a depth of focus of the tilted optical assembly would be along the optical axis 16 instead. In this event, there is a greater likelihood that the top of the fillet 14 which lies outside the focal point 18 might be out of focus when being viewed by the image sensor 22. This would cause the measurement of a height h of the fillet 14 to be unreliable if one cannot ensure that the top of the fillet 14 is in focus.

Figure 3:
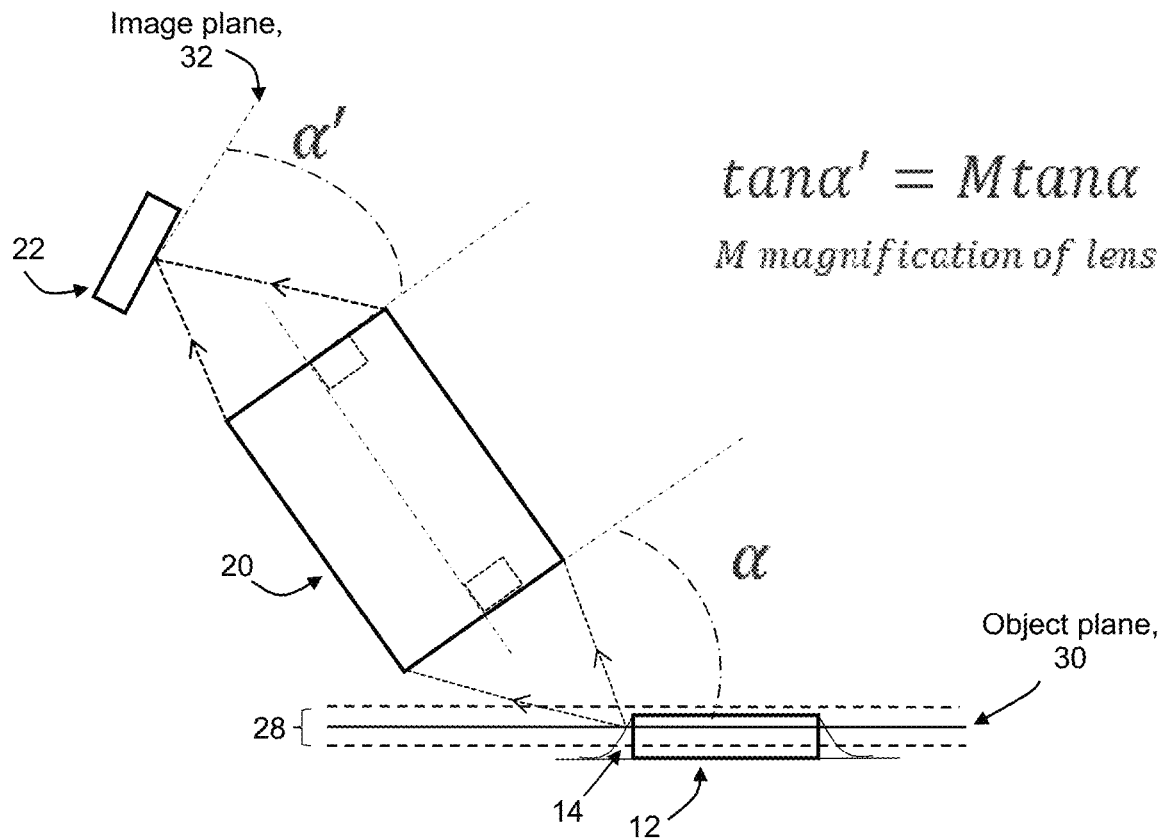
FIG. 3 comprises the schematic illustration of FIG. 2, which further illustrates the principle behind the tilted optical assembly arrangement.

FIG. 3 comprises the schematic illustration of FIG. 2, which further illustrates the principle behind the tilted optical assembly arrangement. The optical system 20 is tilted with respect to an object plane 30 (or top surface of the substrate 10) by $\alpha$, whereas an image plane 32 of the image sensor 22 is tilted with respect to the optical system 20 by $\alpha'$. The relationship between $\alpha$ and $\alpha'$ can be represented by the equation: $\tan \alpha = M \tan \alpha'$, where M is a magnification factor of the lens assembly comprised in the optical system 20.

The values of $\alpha$ and $\alpha'$ are selected so that the depth of focus 28 is substantially vertical, or in other words, substantially perpendicular to the object plane 30, to enable the tilted optical assembly to view the side wall of the semiconductor die 12.

Figure 4:
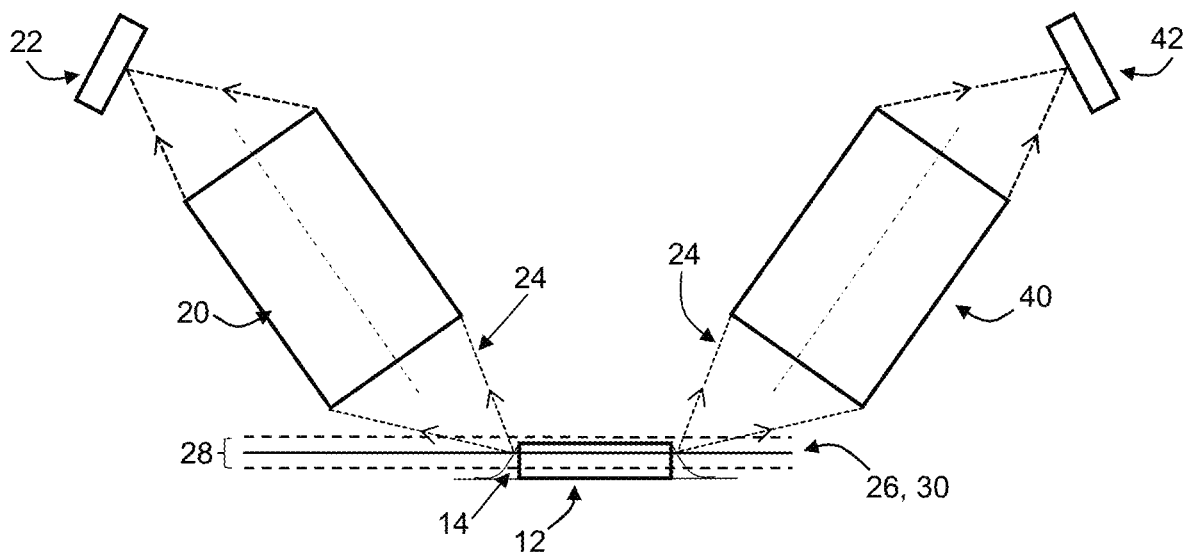
FIG. 4 illustrates a pair of tilted optical assemblies for simultaneously inspecting opposite sides of a bonded semiconductor die.

FIG. 4 illustrates a pair of tilted optical assemblies for simultaneously inspecting opposite sides of a bonded semiconductor die 12. In this illustration, a first tilted optical assembly, comprising a first optical system 20 and a first image sensor 22, is positioned on one side of the semiconductor die 12 whereas a second tilted optical assembly, comprising a second optical system 40 and a second image sensor 42, is positioned on an opposite side of the semiconductor die 12. Hence, the first tilted optical assembly inspects one side of the semiconductor die 12 while the second tilted optical assembly inspects an opposite side of the semiconductor die 12 simultaneously. It should be appreciated that if each tilted optical assembly were to be positioned at a respective corner of the semiconductor die 12 such that each tilted optical assembly is able to view two sides of the semiconductor die 12 at once, all four sides of a quadrilateral-shaped semiconductor die 12 may be viewed and inspected simultaneously when the respective tilted optical assemblies are situated adjacent to opposite corners of the semiconductor die 12 (see, for example, FIG. 6).

Figure 5:
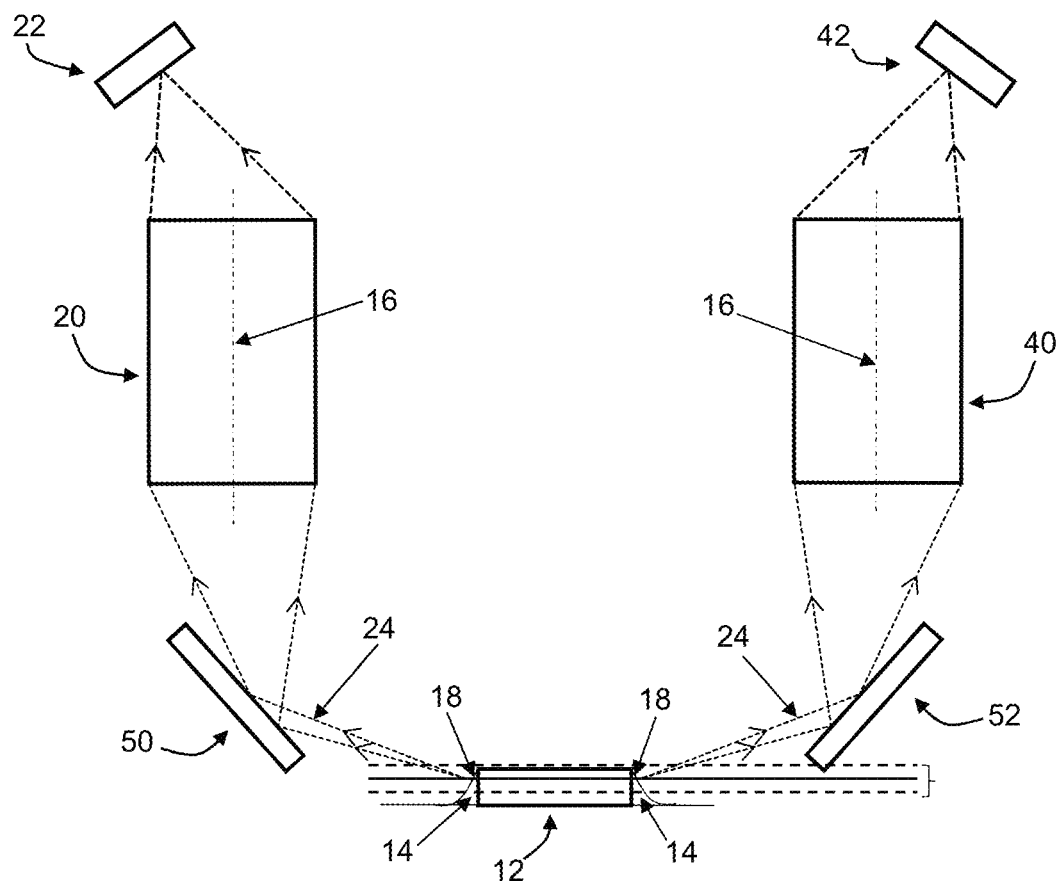
FIG. 5 is a schematic illustration of another preferred embodiment of the invention, in which mirrors are used to make the apparatus more compact.

FIG. 5 is a schematic illustration of another preferred embodiment of the invention, in which mirrors 50, 52 are used to make the apparatus more compact. In this preferred embodiment, the apparatus can be assembled more compactly because the relatively bulky optical systems 20, 40 are arranged vertically in order to occupy a relatively smaller footprint. Hence, the optical axes 16 of the optical systems 20, 40 are perpendicular to the top surface of the substrate 12. The mirrors 50, 52 are arranged below the respective optical systems 20, 40 to reflect images of the side walls of the semiconductor die 12 towards the optical systems 20, 40.

Hence, the first and second mirrors 50, 52 are positioned and inclined at an oblique angle with respect to the top surface of the substrate 12 to re-direct light rays 24 emanating from the focal points 18 of the first and second tilted optical assemblies to the respective vertically-arranged optical systems 20, 40.

In this embodiment, the image sensors 22, 42 are similarly tilted at an oblique angle and offset with respect to the optical axes 16 of the optical systems 20, 40.

Figure 6:
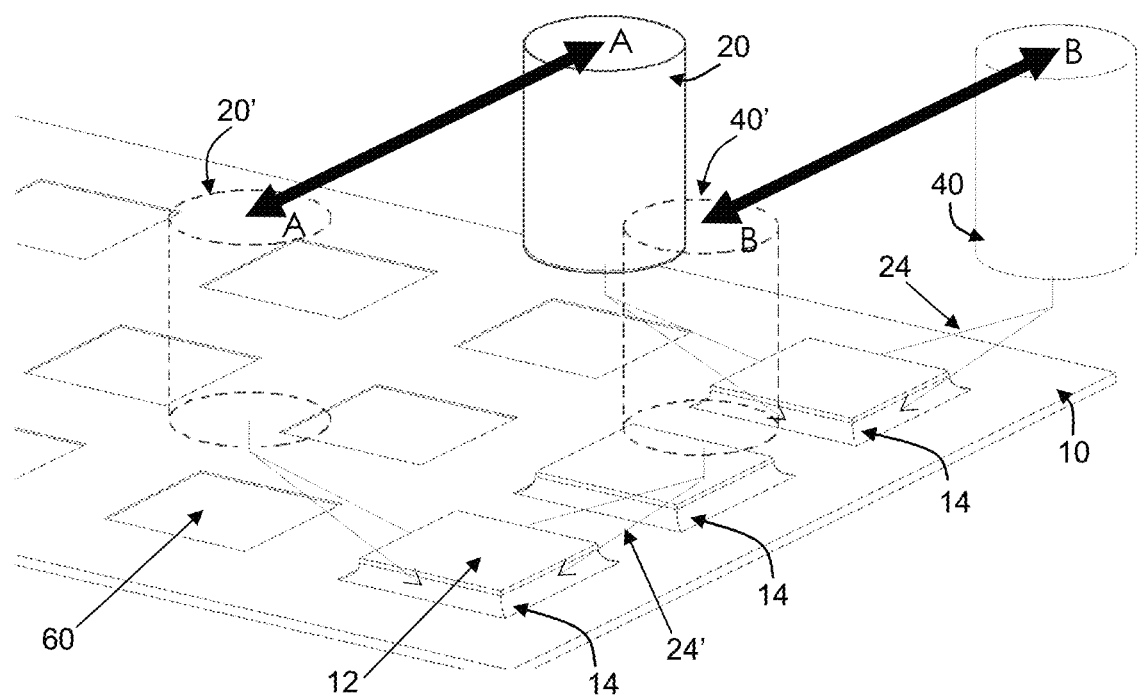
FIG. 6 is an isometric view of an apparatus according to the preferred embodiment of the invention for inspecting an array of semiconductor dice which have been bonded onto a substrate.

FIG. 6 is an isometric view of an apparatus according to the preferred embodiment of the invention for inspecting an array of semiconductor dice 12 which have been bonded onto a substrate 10. In the illustration, three semiconductor dice 12 have been bonded onto bond pads 60 on the substrate 10. Each of the bonded semiconductor dice 12 has a layer of fillet 14 surrounding it. At this time, the inspection apparatus is activated to inspect a row of semiconductor dice 12 to determine their fillet heights h.

Each tilted optical assembly, as generally represented by the first and second optical systems 20, 40, is located diagonally across from the other tilted optical assembly with respect to a semiconductor die 12 when in use in order to each view a corner of the semiconductor die 12. Thus, the two tilted optical assemblies are configured to be located on opposite sides of the semiconductor die 12 to simultaneously inspect opposite sides of the semiconductor die 12 when in use. More specifically, each tilted optical assembly is positioned at a respective corner of the semiconductor die 12 and is operative to view two sides of the semiconductor die 12 at the same time, so that all four sides of the semiconductor die 12 can be inspected simultaneously. As the optical systems 20, 40 are vertically arranged, first and second mirrors (not shown in FIG. 6) are utilized to re-direct light rays 24 from the sides of the semiconductor dice 12 towards the optical systems 20, 40.

After a first semiconductor die 12 has been inspected and the height h of the fillet 14 surrounding it is determined, the tilted optical assemblies are moved relative to the substrate 10 by way of a moving mechanism so that the tilted optical assemblies are positioned to view the sides of another semiconductor die 12 in the array of semiconductor dice 12. It should be appreciated that such relative motion may be achieved by either moving the substrate 10, moving the tilted optical assemblies, or a combination of both movements.

The travelling path of the tilted optical assemblies will continue to end positions of the optical systems 20', 40', by which time the tilted optical assemblies would have inspected all the semiconductor dice 12 in the first row. If no defects are discovered, more particularly, if a height of the fillet 14 surrounding the semiconductor die 12 is within a predetermined range, the bonding of further semiconductor dice 12 onto subsequent bond pads 60 may continue with confidence. It means, for instance, that the bonding parameters have been set correctly and changes need to be made to avoid bonding defects.

Figure 7:
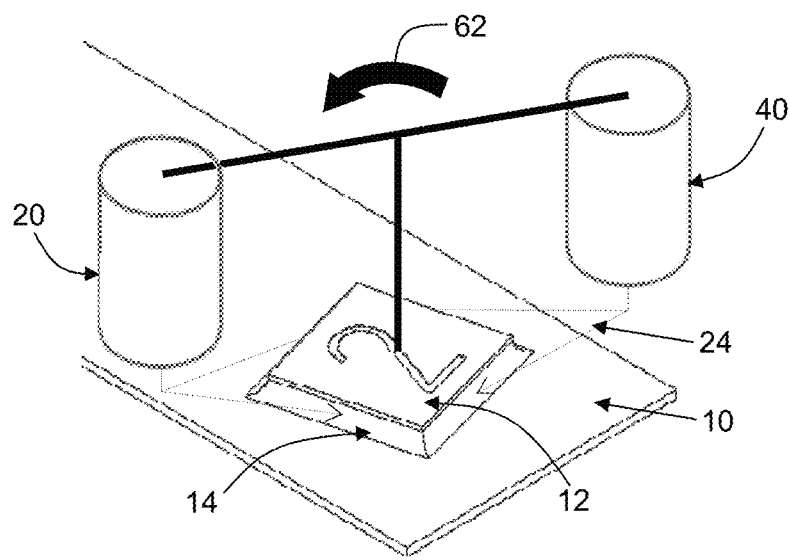
FIG. 7 is an isometric illustration of dual optical assemblies that are rotatable relative to a substrate.

FIG. 7 is an isometric illustration of dual optical assemblies that are rotatable relative to a substrate 10. A semiconductor die 12 that has been bonded on the substrate 10 is misaligned relative to a conveying direction of the substrate 10. In order to obtain an equivalent image to that obtained when the semiconductor die 12 is aligned to the conveying direction, the moving mechanism for moving the optical assemblies relative to the substrate 10 as described in relation to FIG. 6 is also operative to rotate the optical assemblies together relative to the substrate 10. In the illustration of FIG. 7, the optical assemblies are rotated counterclockwise so that each tilted optical assembly is again positioned at a respective corner of the semiconductor die 12 and is operative to view two sides of the semiconductor die 12 at the same time, so that all four sides of the semiconductor die 12 can be inspected simultaneously. Accordingly, the light rays 24 are again re-directed from all four sides of the semiconductor dice 12 towards the optical systems 20, 40.

Since the apparatus and method according to the invention is capable of viewing all four sides of a semiconductor die 12 simultaneously, besides fillet height (h), other aspects of die bonding quality such as die tilt (based on relative heights of the respective sides of the die) and BLT (thickness of an epoxy layer between the die and the substrate) can also be determined using the same approach.

It should be appreciated that the inspection apparatus and method described above enables the creation of an integrated solution in die bonding machine to achieve both die bonding and online inspection. Hence, indicators of bonding quality, such as fillet height, die tilt and BLT may be determined immediately for closed-loop feedback and control. Bonded semiconductor dice 12 that are defective are determinable instantly.

Moreover, since inspection may be conducted immediately after a bonding process, real-time adjustment of bonding parameters such as bond height, fillet height, die tilt and BLT are variable in the midst of the bonding process. For instance, epoxy writing parameters are adjustable for the next substrate 10 that undergoes die bonding.

Since a focal plane 26 and object plane 30 of the tilted optical assembly is parallel to a plane of the upper surface of the semiconductor die 12 and the substrate 10, no movement to adjust the relative positions of the respective tilted optical assemblies is required to cater for different semiconductor die sizes. This is because a shift in position of the semiconductor die 12 along a horizontal plane would not affect its focus as viewed by the tilted optical assemblies. Furthermore, only two tilted optical assemblies are required to inspect all four edges of a semiconductor die 12 simultaneously, and the relation between the slanted tilted optical assemblies can be fixed to form a stereo system for the various measurements as desired.

It should also be appreciated that the application is not limited to online inspection, as the apparatus and method described herein is also applicable for cost-effective solution for offline measurement of fillet height in stand-alone automated optical inspection machine.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for inspecting a semiconductor die bonded on a top surface of a substrate, the apparatus comprising:
   an optical assembly tilted at an oblique angle with respect to the top surface of the substrate, the optical assembly including an image sensor and an optical system;
   wherein the optical assembly is arranged such that its depth of focus is substantially perpendicular to the top surface of the substrate for inspecting at least one side wall of the semiconductor die.

2. The apparatus as claimed in claim 1, wherein a focal point of the optical assembly is arranged such that the image sensor and the focal point are both offset from an optical axis of the optical system.

3. The apparatus as claimed in claim 2, wherein the image sensor and the focal point are located on opposite sides of the optical axis of the optical system.

4. The apparatus as claimed in claim 2, wherein the optical assembly is movable relative to the substrate, such that a virtual focal plane of the optical assembly coincident with positions of the focal point as the optical assembly moves is generally parallel to a plane defined by the top surface of the substrate.

5. The apparatus as claimed in claim 4, wherein a depth of focus of the optical assembly relative to the virtual focal plane is configured to extend transversely to the virtual focal plane for a certain distance above and below the virtual focal plane of the optical assembly.

6. The apparatus as claimed in claim 5, wherein the depth of focus of the optical assembly corresponds to a vertical side wall of the semiconductor die for ensuring that an image of a top of a fillet surrounding the semiconductor die along the side wall of the semiconductor die which lies within a range of heights outside the virtual focal plane is in focus.

7. The apparatus as claimed in claim 1, wherein the optical system is tilted with respect to the top surface of the substrate by an angle $\alpha$, and an image plane of the image sensor is tilted with respect to the optical system by an angle $\alpha'$ such that: $\tan \alpha = M \tan \alpha'$; the optical system comprises a lens assembly, where M is a magnification factor of the lens assembly comprised in the optical system.

8. The apparatus as claimed in claim 1, further comprising a second optical assembly, wherein the optical assembly and the second optical assembly are configured to be located on opposite sides of the semiconductor die when in use.

9. The apparatus as claimed in claim 8, wherein the optical assembly and the second optical assembly are arranged and operative to simultaneously inspect opposite sides of the semiconductor die.

10. The apparatus as claimed in claim 9, wherein each optical assembly is arranged and operative to inspect two different sides of the semiconductor die respectively at the same time, such that four sides of the semiconductor die are inspected simultaneously.

11. The apparatus as claimed in claim 10, wherein each optical assembly is positioned at a respective corner of the semiconductor die for viewing the two different sides of the semiconductor die at the same time.

12. The apparatus as claimed in claim 1, wherein the optical assembly further comprises a mirror that is inclined at an oblique angle with respect to the top surface of the substrate for transmitting light rays reflected from the at least one side wall of the semiconductor die towards the optical system and the image sensor.

13. The apparatus as claimed in claim 12, wherein the optical system is arranged vertically such that its optical axis is perpendicular to the top surface of the substrate.

14. The apparatus as claimed in claim 13, wherein the image sensor is tilted at an oblique angle and offset with respect to the optical axis of the optical system.

15. Apparatus for inspecting a semiconductor die bonded on a top surface of a substrate, the apparatus comprising:
a first optical assembly and a second optical assembly, each optical assembly being tilted at an oblique angle with respect to the top surface of the substrate, and each optical assembly including an image sensor and an optical system;
wherein each of the first and second optical assemblies is arranged such that its depth of focus is substantially perpendicular to the top surface of the substrate for inspecting at least one side wall of the semiconductor die.

16. The apparatus as claimed in claim 15, further comprising a moving mechanism for moving the first and second optical assemblies relative to the substrate for inspecting an array of semiconductor dice bonded on a top surface of the substrate, and the moving mechanism being further operative to rotate the first and second optical assemblies together relative to the substrate.

17. The apparatus as claimed in claim 15, wherein the first optical assembly is configured and arranged substantially diagonally across from the second optical assembly with respect to the semiconductor die when in use.

* * * * *